United States Patent
Dubois et al.

(10) Patent No.: US 9,105,687 B1
(45) Date of Patent: Aug. 11, 2015

(54) METHOD FOR REDUCING DEFECTS IN SHALLOW TRENCH ISOLATION

(71) Applicant: NXP B.V., Eindhoven (NL)

(72) Inventors: Jerome Dubois, Singapore (SG); Piet Wessels, Nijmegen (NL); Gaurav Singh Bisht, Singapore (SG); Jayaraj Thillaigovindan, Tamilnadu (IN); Eric Ooms, Wijchen (NL); Naveen Agrawal, Rajasthan (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/254,523

(22) Filed: Apr. 16, 2014

(51) Int. Cl.
*H01L 21/762* (2006.01)
*H01L 21/321* (2006.01)
*H01L 21/306* (2006.01)

(52) U.S. Cl.
CPC .... *H01L 21/76235* (2013.01); *H01L 21/30604* (2013.01); *H01L 21/3212* (2013.01); *H01L 21/76224* (2013.01)

(58) Field of Classification Search
CPC ............ H01L 21/76224; H01L 21/31053; H01L 27/10876; H01L 21/823481; H01L 21/76232; H01L 21/76; H01L 21/76229; H01L 21/76283; H01L 21/02057; H01L 21/76281; H01L 21/823878; H01L 27/1463; H01L 21/76235; H01L 21/3212; H01L 21/30604
See application file for complete search history.

(56) References Cited

U.S. PATENT DOCUMENTS

| | | | |
|---|---|---|---|
| 5,747,377 A | 5/1998 | Wu | |
| 6,723,144 B2 | 4/2004 | Katagiri et al. | |
| 6,825,544 B1 * | 11/2004 | Jin | 257/499 |
| 7,303,951 B2 | 12/2007 | Kanamitsu et al. | |
| 2004/0126962 A1 | 7/2004 | Ma et al. | |

OTHER PUBLICATIONS

Xia, Jay et al.; "Study on Silicon Cone Defects at Post Shallow Trench Isolation Etch"; Kilby Center, Silicon Technollgy Development, Texas Instruments; 1 pg.; 2009.

* cited by examiner

*Primary Examiner* — Yasser A Abdelaziez
*Assistant Examiner* — Farun Lu

(57) ABSTRACT

A method of manufacturing a semiconductor device includes forming a trench that includes a needle defect, depositing a high density plasma oxide over the trench including the needle defect, removing the part of the high density oxide and the liner oxide over the needle defect by applying an oxide etch, and after the step of applying the oxide etch, etching back the needle defect by applying a polysilicon etch.

20 Claims, 7 Drawing Sheets

METHOD FOR REDUCING DEFECTS IN SHALLOW TRENCH ISOLATION

Embodiments of the invention relate to a method of manufacturing shallow trench isolation (STI), and more particularly of improving the STI reliability by reducing defects.

Shallow trench isolation regions are formed by thermally oxidizing a silicon substrate to form a silicon oxide layer on the surface of the silicon substrate. A silicon nitride layer is then deposited on top of the silicon oxide layer by chemical vapor deposition (CVD). The silicon nitride layer is patterned and used as a mask for etching a trench into the silicon substrate. However, small particles inherently present on the surface of the silicon layer, nitride layer, resist layer or substrate can block the etching process and cause defects.

One common type of defect is a needle defect, where a particle blocks the etching process, which then produces a needle shaped defect underneath the blocked area within the shallow trench isolation region. Other types of defects can also be produced, such as cone shaped or pillar shaped defects. A needle or other defect may cause unwanted electrical breakdown between the silicon substrate and an active region above the shallow trench isolation region. This may occur because the distance between the top of the needle defect and the active region is greatly reduced compared to the intended isolation distance given by the depth of the shallow trench isolation region. The reduced isolation distance is especially critical during high voltage operation.

In view of these concerns, there is a need for reducing defects during the manufacturing steps of shallow trench isolation regions.

A method of manufacturing a semiconductor device in accordance with an embodiment of the invention includes forming a trench that includes a needle defect, depositing a high density plasma oxide over the trench including the needle defect, removing the part of the high density oxide and the liner oxide over the needle defect by applying an oxide etch, and after the step of applying the oxide etch, etching back the needle defect by applying a silicon etch.

Other aspects and advantages of the present invention will become apparent from the following detailed description, taken in conjunction with the accompanying drawings, illustrated by way of example of the principles of the invention.

FIGS. 4A-4E depict a third embodiment of a method of reducing defects in shallow trench isolation It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes that come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

With reference to FIGS. 1A-1D, a method of manufacturing a trench in a semiconductor device is shown.

Figure 1A:
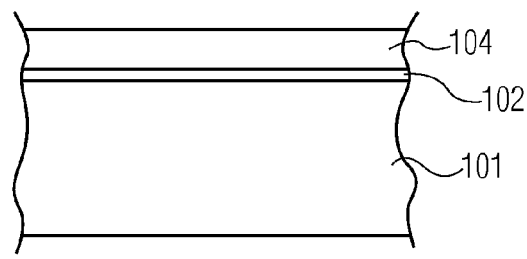
FIGS. 1A-1D depict the formation of a trench with a needle defect.

In the example of FIG. 1A, a layer stack is formed on the surface of a semiconductor substrate 101, such as a silicon substrate. The layer stack includes a silicon oxide layer 102 on the surface of the semiconductor substrate 101 and a silicon nitride layer 104 on top of the silicon oxide layer 102. The silicon oxide layer 102 is formed, for example, by thermally oxidizing the semiconductor substrate 101. The silicon nitride layer 104 is then deposited on top of the silicon oxide layer 102 by chemical vapor deposition (CVD) or another deposition technique.

Figure 1B:
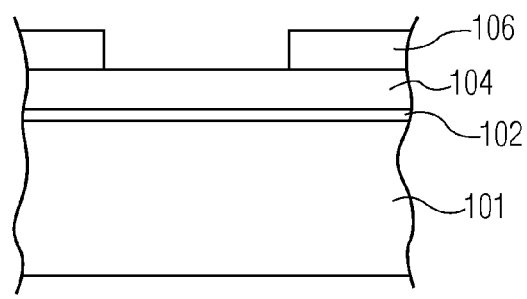

Following the layer stack formation, a resist 106 is formed on top of the silicon nitride layer 104 and a pattern transfer is performed in the resist 106, as shown in FIG. 1B. The patterning process can be performed using a positive resist or a negative resist using any suitable patterning technique, such as photolithography through a mask. The pattern defines an isolation region where a shallow trench isolation will be formed, as will be described in more detail below.

Figure 1C:
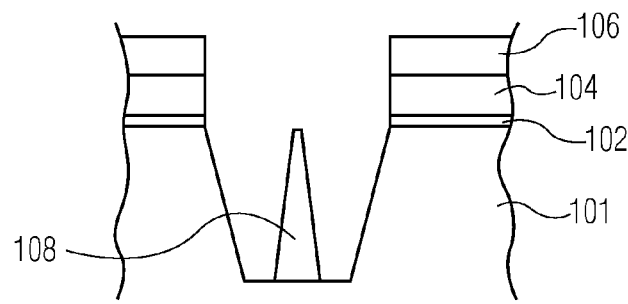

In the example of FIG. 1C, a trench is formed within the isolation region defined by the patterned resist. In one embodiment, the trench is etched by dry etching using the resist 106 and the patterned silicon nitride layer 104 as a mask. The dry etching removes the part of the silicon oxide layer 102 in the isolation region, and creates a recess in the top surface of the semiconductor substrate 101 in the isolation region.

In the example of FIG. 1C, the etch process is blocked, for example by a particle on the surface of the semiconductor substrate 101, thereby forming a needle defect 108 beneath the particle blocking the etch process. The trench formation can also produce any other type of unwanted defect, such as a pillar defect or cone defect. The term needle defect is used in the following descriptions of the embodiments, but the embodiments are not limited to needle defects and can also be applied to any other defects occurring during the formation of trenches in semiconductor devices. In one embodiment, the needle defect 108 is protruding from the bottom surface of the trench, as shown in FIG. 1C. In another embodiment, the needle defect is protruding from the sidewalls of the trench. More than one defect may also be formed.

The height of the needle defect 108 as shown in FIG. 1C is approximately the same height as the depth of the recess within the semiconductor substrate 101. In other words, the top of the needle defect 108 is near the level of the top surface of the semiconductor substrate 101. However, the embodiments are not limited to this height.

Figure 1D:
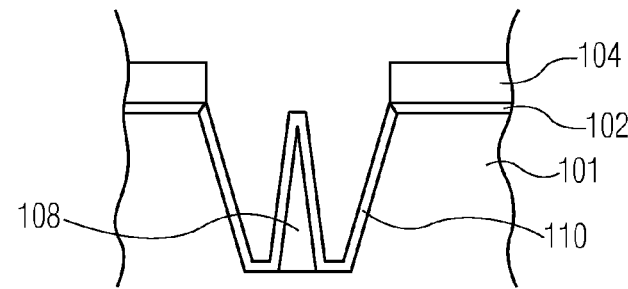

In the example of FIG. 1D, a liner oxide 110 is formed within the isolation region. A thermal oxidation process can be used to form the liner oxide 110. In this embodiment, the liner oxide 110 is formed at the surface of the sidewalls of the trench, at the bottom of the trench, and over the surface of the needle defect 108. In one embodiment, the thickness of the liner oxide 110 is about 25 nm.

Figure 2A:
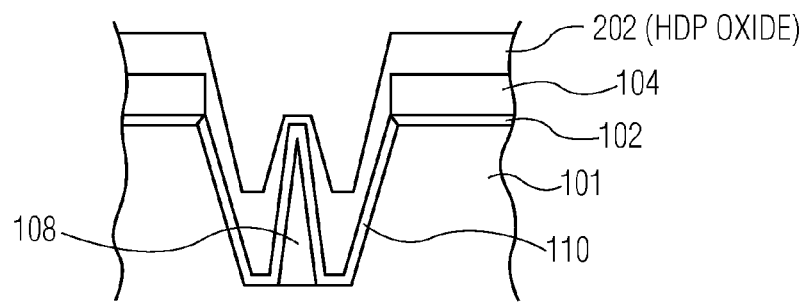
FIGS. 2A-2F depict a first embodiment of a method of reducing defects in shallow trench isolation.

Turning now to FIG. 2A, a high density plasma (HDP) oxide 202 is formed on top of the semiconductor device, covering the patterned silicon nitride layer 106 and partially filling the trench. The process step shown in FIG. 2A follows the process step as described with reference to FIG. 1D above. Alternatively, the step of forming a liner oxide as described in FIG. 1D may be skipped and the HDP oxide 202 may be directly formed in the trench on top of and in contact with the semiconductor substrate 101.

In the example of FIG. 2A, because of the inherent nature of the HDP oxide deposition and sputter process used to form the HDP oxide 202, only a thin layer of HDP oxide is deposited on small areas such as the top of the needle defect 108 as compared to larger areas such as the bottom of the trench and the trench sidewalls where a thicker layer of HDP oxide is usually deposited. As shown in FIG. 2A, the trench is only partially filled with the HDP oxide 202 and the thickness of the deposited HDP oxide 202 over the top of the needle defect 108 is much smaller than the thickness of the deposited HDP oxide 202 over the bottom and sidewalls of the trench.

In one embodiment, the HDP oxide deposition uses conditions that yield a 2.5K HDP, which produces a film of HDP oxide with a thickness of about 2500 angstrom (250 nm) on large flat surfaces such as the silicon nitride layer 104. In this embodiment, the thickness of the HDP oxide 202 deposited over the bottom and sidewalls of the trench is also on the order of 250 nm, whereas the thickness of the HDP oxide 202 deposited over the upper parts of the sidewalls of the needle defect 108 and over the top of the needle defect is much smaller and can be on the order of 25 nm or less. In the example of FIG. 2A, the thickness of the deposited HDP oxide 202 diminishes radially towards the central vertical axis of the needle defect 108.

Figure 2B:
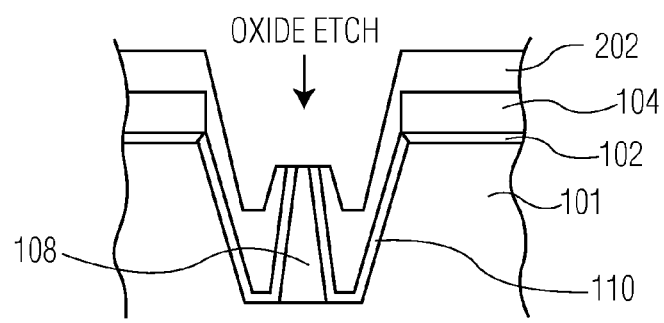

Turning now to FIG. 2B, an oxide etch is applied to remove the parts of the HDP oxide 202 and liner oxide 110 covering the top of the needle defect 108, thereby exposing the top of the needle defect, whereas the sidewalls and the bottom of the trench are still covered by the liner oxide 110 and the HDP oxide 202. The oxide etch can be a dry etch or a wet etch, such as reactive ion etching, chemical dry etching, buffered oxide etch, or any other suitable technique used to etch oxide films. In one embodiment, the oxide etch uses parameters to remove a thickness of oxide equal to the combined thickness of the liner oxide 110 and HDP oxide 202 over the top of the needle defect 108. For example, if the liner oxide 110 measures 25 nm and the HDP oxide measures 25 nm over the top of the needle defect 108, then an oxide etch resulting in a 50 nm oxide removal can be used to expose the top of the needle defect while leaving the bottom and sidewalls of the trench covered in HDP oxide.

Figure 2C:
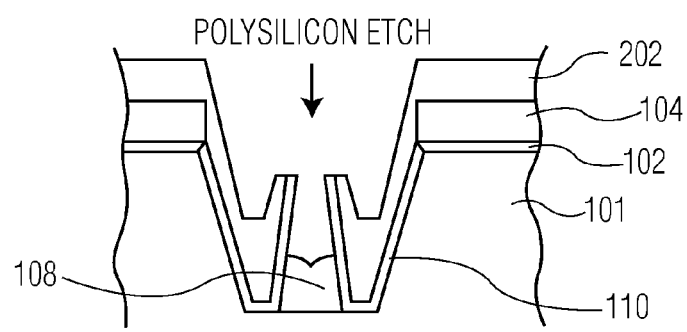

Turning now to FIG. 2C, a polysilicon or silicon etch is applied to reduce the height of the needle defect 108. The polysilicon or silicon etch can be a dry etch or a wet etch using any suitable technique to remove at least parts of the needle defect 108. Because the top of the needle defect 108 is exposed, the polysilicon or silicon etch reaches the top of the needle defect and etches back the needle defect beginning from the top and progressing towards the bottom during the etching process. The polysilicon or silicon etch is highly selective to silicon oxide and therefore selectively etches back the needle defect 108 while leaving the HDP oxide 202 intact. Accordingly, the height of the needle defect 108 is reduced after the polysilicon or silicon etch as compared to the height of the needle defect before the etching process. The polysilicon or silicon etch does not attack the trench, and thus the sidewalls of the trench are not affected by the polysilicon or silicon etch. Examples of a polysilicon or silicon etch use parameters to reduce the height of the needle defect 108 by about 300 nm.

Figure 2D:
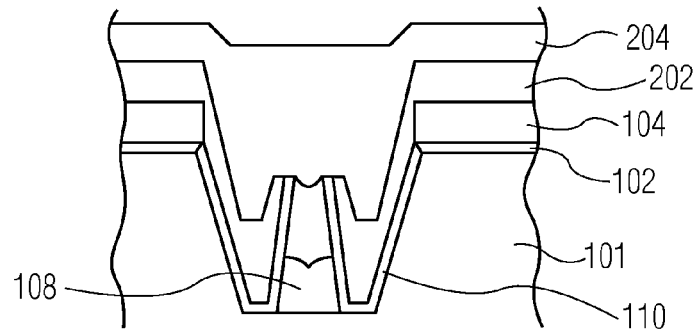
Figure 2E:
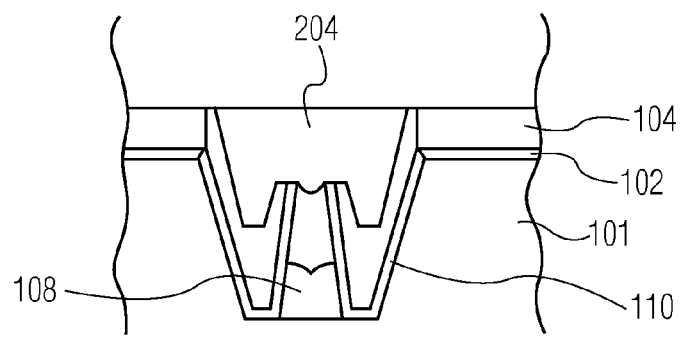
Figure 2F:
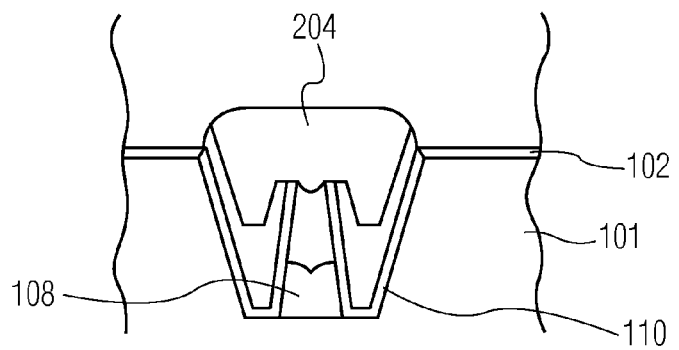

Turning now to FIG. 2D, a further HDP oxide 204 is deposited over the semiconductor device to fill the remainder of the trench. In one embodiment, the deposition of the HDP oxide 204 leaves a small air gap between the HDP oxide 204 and the needle defect 108, as shown in FIG. 2D. In another embodiment, the HDP oxide 204 is in direct contact with the needle defect 108. A chemical mechanical planarization (CMP) can then be performed such that the silicon nitride layer 104 is exposed, as shown in FIG. 2E. The silicon nitride layer 104 may then be removed to form the shallow trench isolation region as shown in FIG. 2F.

Figure 3A:
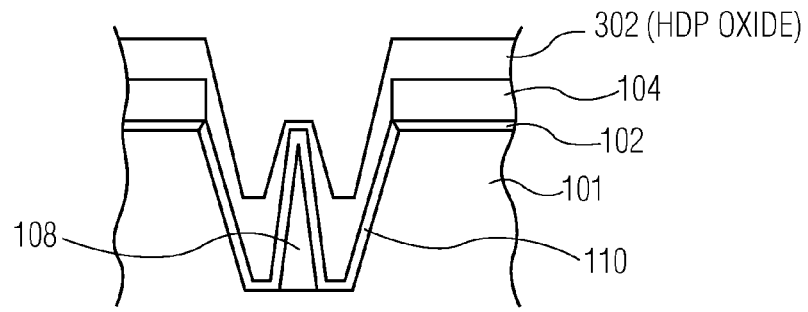
FIGS. 3A-3F depict a second embodiment of a method of reducing defects in shallow trench isolation.

Turning now to FIG. 3A, a high density plasma (HDP) oxide 302 is formed on top of the semiconductor device, similar to the process step described above with reference to FIG. 2A. The process step shown in FIG. 3A follows the process step as described with reference to FIG. 1D above. The HDP oxide 302 covers the remaining silicon nitride layer 104 and partially fills the trench.

In the example of FIG. 3A, the thickness of the HDP oxide 302 on the sidewalls of the trench may be smaller than the thickness of the HDP oxide at the bottom of the trench. Further, only a very thin layer of HDP oxide 302 is deposited over the top of the needle defect 108. In order to protect the sidewalls of the trench from being etched further during subsequent process steps, the subsequent etching of the needle defect 108 can be done in a masked way, as described in more detail below with reference to FIGS. 3B-3F.

Figure 3B:
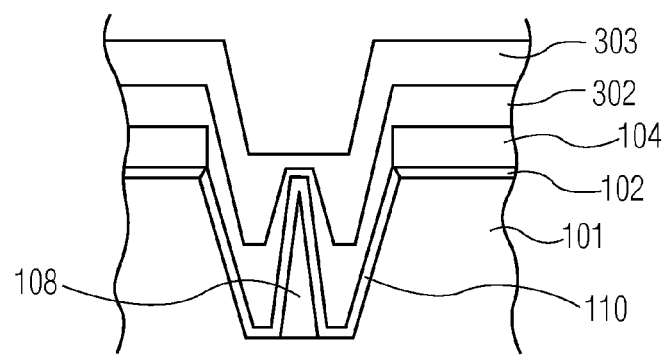
Figure 3C:
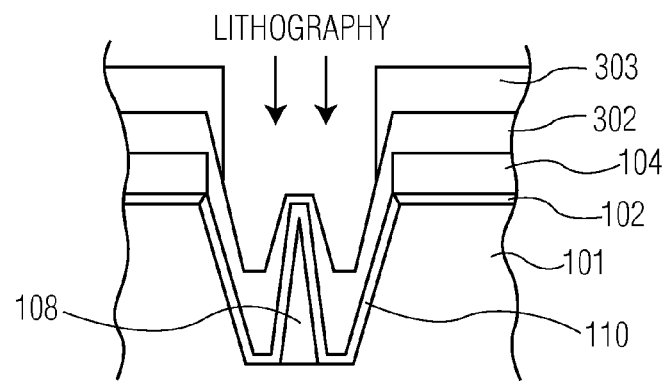

Turning now to FIG. 3B, a resist 303 such as a photoresist is formed over the trench. The resist 303 is patterned to remove the part of the resist 303 that is above the needle defect, as shown in FIG. 3C. Patterning of the resist may be done, for example, in a masked way using a photomask and photolithography, or may be done without a mask. In the example of FIG. 3C, patterning of the resist 303 is done in such a way that the sidewalls of the trench are still at least partially covered by the resist 303, while the HDP oxide 302 above the top of the needle defect is exposed. The patterned resist 303 then acts as a mask for subsequent etching steps, as described below with reference to FIGS. 3D and 3E.

Figure 3D:
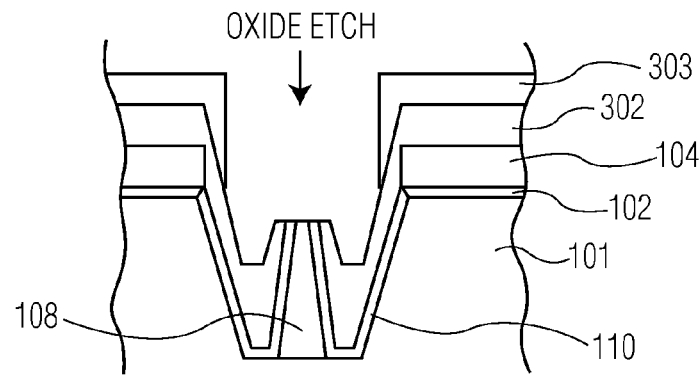

Turning now to FIG. 3D, an oxide etch is applied to remove the HDP oxide 302 and liner oxide 110 covering the top of the needle defect 108, thereby exposing the top of the needle defect. During the oxide etch, the sidewalls of the trench are protected by the resist 303, thereby preventing the oxide etch from etching through the HDP oxide 302 and liner oxide 110 above the sidewalls and into the semiconductor substrate 101.

Figure 3E:
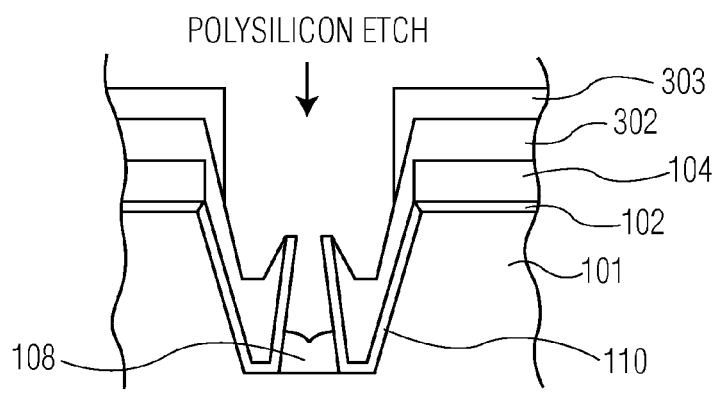

Turning now to FIG. 3E, a polysilicon or silicon etch is applied to reduce the height of the needle defect 108. Because the top of the needle defect 108 is exposed, the polysilicon or silicon etch reaches the top of the needle defect and etches back and reduces the height of the needle defect. Because of the protective properties of the HDP oxide 302 and the resist 303, the polysilicon or silicon etch does not affect the trench of the trench isolation region and does not affect the rest of the processing steps.

Figure 3F:
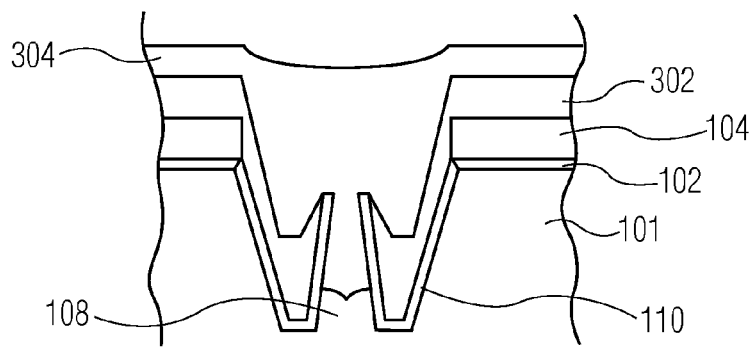

Turning now to FIG. 3F, a further HDP oxide 304 is deposited over the semiconductor device to fill the remainder of the trench to form a shallow trench isolation region as shown in FIG. 3F. In the example of FIG. 3F, the HDP oxide 304 is directly deposited over the needle defect 108 and is in contact with the needle defect. In another embodiment, the deposition of the HDP oxide 304 creates a small void between the HDP oxide 304 and the needle defect 108.

Figure 4A:
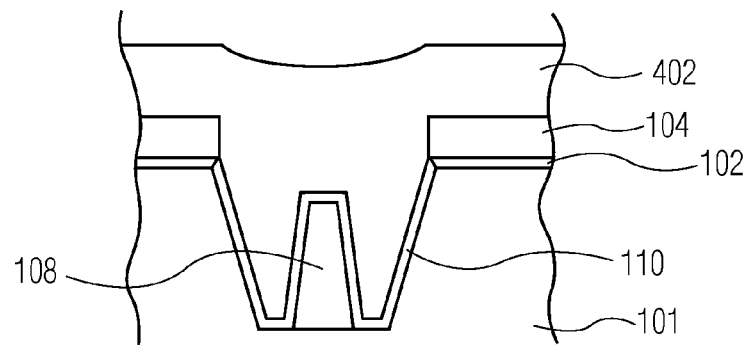

Turning now to FIG. 4A, a high density plasma (HDP) oxide 402 is formed on top of the semiconductor device. The process step shown in FIG. 4A follows the process step as described with reference to FIG. 1D above. The HDP oxide 302 covers the remaining silicon nitride layer 104 and fully fills the trench to form a shallow trench isolation.

Figure 4B:
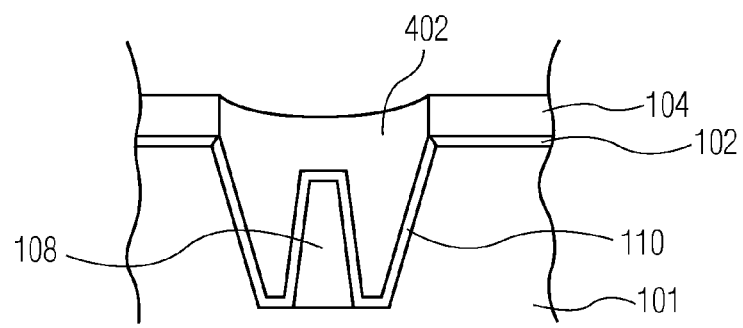
Figure 4C:
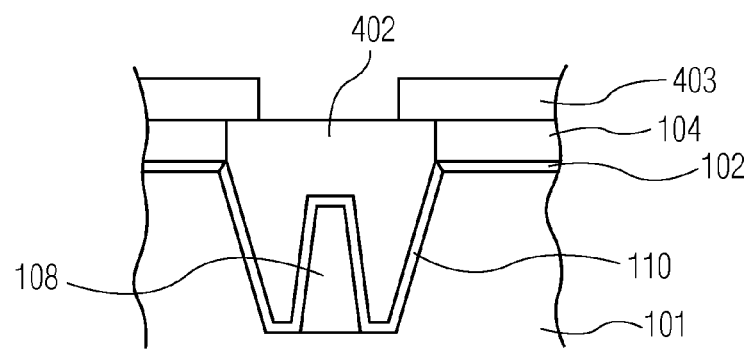

Turning now to FIG. 4B, a chemical mechanical planarization (CMP) is performed on the surface of the semiconductor device. Turning now to FIG. 4C, a resist 403 such as a photoresist is formed over the trench. The resist 403 is patterned to remove the part of the resist 403 that is above the needle defect while leaving the resist 403 above the sidewalls of the trench, as shown in FIG. 4C. Patterning of the resist may be done, for example, in a masked way using photolithography.

Figure 4D:
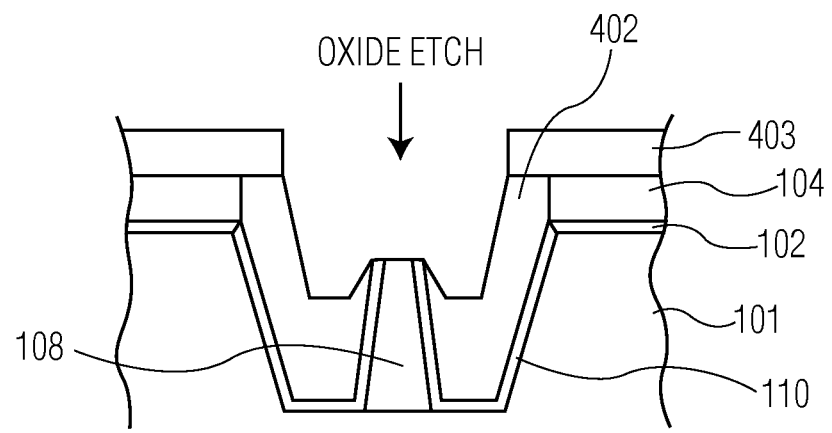

Turning now to FIG. 4D, an oxide etch is applied to remove the HDP oxide 402 and liner oxide 110 covering the top of the needle defect 108, thereby exposing the top of the needle defect. The patterned resist 403 acts as a mask for subsequent etching steps. During the oxide etch, the sidewalls of the trench are protected by the resist 403, thereby preventing the oxide etch from etching through the HDP oxide 402 and liner oxide 110 above the sidewalls and into the semiconductor substrate 101.

Figure 4E:
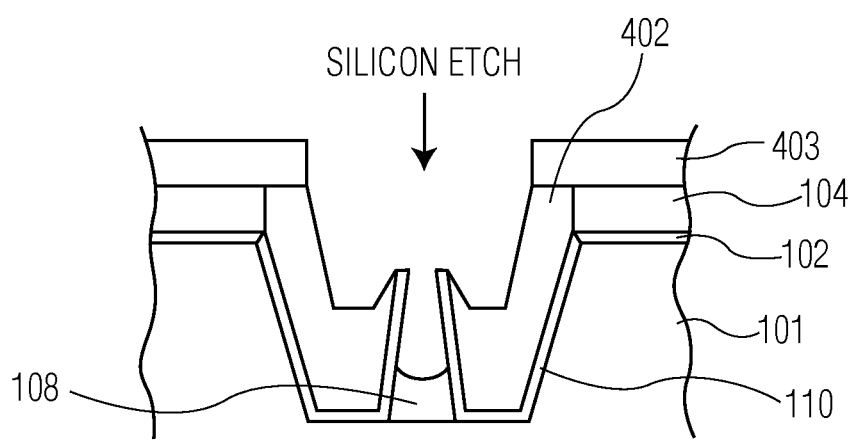

Turning now to FIG. 4E, a silicon etch is applied to reduce the height of the needle defect 108. Because of the protective properties of the HDP oxide 402 and the resist 403, the silicon etch does not affect the shape of the trench of the shallow trench isolation region. In subsequent processing steps, the trench may be filled with a further HDP oxide and a further CMP may be performed to produce a shallow trench isolation with a reduced needle defect.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method of manufacturing a semiconductor device, the method comprising:

forming a trench that includes a needle defect;
depositing a high density plasma oxide and a liner oxide over the trench including the needle defect;
removing the part of the high density oxide and the liner oxide over the needle defect by applying an oxide etch; and
after the step of applying the oxide etch, etching back the needle defect by applying a silicon etch.

2. The method of claim 1, wherein the step of forming the trench further includes forming a liner oxide over the trench that includes the needle defect.

3. The method of claim 1, wherein the trench is formed by:
forming a silicon oxide layer on the surface of a semiconductor substrate;
forming a silicon nitride layer on top of the silicon oxide layer;
forming a resist layer over the silicon nitride layer;
patterning the resist layer to define an isolation region;
etching the silicon nitride layer, the silicon oxide layer, and the semiconductor substrate in the isolation region by using the patterned resist layer as a mask;
removing the remaining resist layer.

4. The method of claim 3 further comprising:
after the step of etching back the needle defect, filling the trench with a further high density plasma oxide.

5. The method of claim 3 further comprising:
after the step of filling the trench with a further high density plasma oxide, exposing the remaining silicon nitride layer by performing a chemical mechanical planarization of the further high density plasma oxide.

6. The method of claim 4 further comprising:
after the step of exposing the silicon nitride layer, forming a shallow trench isolation by removing the remaining silicon nitride layer.

7. The method of claim 1, wherein the needle defect is in a bottom part of the trench.

8. The method of claim 6 further comprising, between the step of depositing the high density plasma oxide and the step of removing the part of the high density oxide and the liner oxide:
forming a further resist layer over the HDP oxide;
patterning the further resist layer wherein the patterned further resist layer at least partially covers sidewalls of the trench while exposing a bottom part of the trench.

9. The method of claim 2, wherein the step of etching the silicon nitride layer uses reactive-ion etching.

10. The method of claim 1, wherein the silicon etch is a wet etch.

11. The method of claim 1, wherein the silicon etch is a dry etch.

12. The method of claim 1, wherein the oxide etch is performed to a depth about equal to the combined thickness of the liner oxide and the HDP oxide above the top of the needle defect.

13. The method of claim 7, wherein the thickness of the liner oxide and the HDP oxide on the sidewalls is greater than the thickness of the liner oxide and the HDP oxide above the top of the needle defect, wherein the etching depth is larger than the thickness of the liner oxide and the HDP oxide above the top of the needle defect and smaller than the thickness of the liner oxide and the HDP oxide on the sidewalls of the trench.

14. The method of claim 1, wherein the oxide etch is done to a depth of about 50 nm.

15. The method of claim 1, wherein the polysilicon etch is done to a depth of about 300 nm.

16. The method of claim 2, wherein the step of depositing a high density plasma oxide over the trench includes partially filling the trench with the high density plasma oxide.

17. The method of claim 3, wherein the step of depositing a high density plasma oxide over the trench includes fully filling the trench with the high density plasma oxide and performing a chemical mechanical planarization on the high density plasma oxide.

18. A method of manufacturing a shallow trench isolation in a semiconductor device, the method comprising:
- forming a layer stack including: a silicon oxide layer on the surface of a semiconductor substrate, a silicon nitride layer on top of the silicon oxide layer, and a photoresist layer on top of the silicon nitride layer;
- patterning the photoresist layer to define a trench isolation region;
- forming a trench by etching the silicon nitride layer, the silicon oxide layer, and the semiconductor substrate in the trench isolation region by using the patterned photoresist layer as a mask, wherein the trench includes a needle defect;
- removing the remaining photoresist layer;
- forming a liner oxide over the trench including the needle defect;
- depositing a high density plasma oxide over the trench including the needle defect;
- forming a further photoresist layer over the high density plasma oxide;
- patterning the further photoresist layer wherein the patterned further photoresist layer at least partially covers sidewalls of the trench while exposing a bottom part of the trench;
- removing the part of the high density oxide and the liner oxide over the needle defect by applying an oxide etch; and
- after the step of applying the oxide etch, etching back the needle defect by applying a polysilicon etch.

19. The method of claim 18 further comprising:
- after the step of etching back the needle defect, filling the trench with a further high density plasma oxide.

20. The method of claim 19 further comprising:
- after the step of filling the trench with a further high density plasma oxide, exposing the remaining silicon nitride layer by performing a chemical mechanical planarization of the further high density plasma oxide.

* * * * *